(12) United States Patent
Mei et al.

(10) Patent No.: US 7,164,961 B2
(45) Date of Patent: Jan. 16, 2007

(54) MODIFIED PHOTOLITHOGRAPHY MOVEMENT SYSTEM

(75) Inventors: Wenhui Mei, Plano, TX (US); Akira Ishikawa, Royse Ctiy, TX (US)

(73) Assignee: Disco Corporation, Tokyo (JP)

( * ) Notice: Subject to any disclaimer, the term of this patent is extended or adjusted under 35 U.S.C. 154(b) by 760 days.

(21) Appl. No.: 10/064,156

(22) Filed: Jun. 14, 2002

(65) Prior Publication Data

US 2003/0233528 A1    Dec. 18, 2003

(51) Int. Cl.
*G06F 19/00*   (2006.01)

(52) U.S. Cl. .................. 700/121; 700/117; 359/223

(58) Field of Classification Search ........ 700/120–121, 700/117, 95; 359/212, 223, 226; 348/743, 348/771
See application file for complete search history.

(56) References Cited

U.S. PATENT DOCUMENTS

| | | | |
|---|---|---|---|
| 3,534,467 A | 10/1970 | Sachs et al. |
| 4,126,812 A | 11/1978 | Wakefield |
| 4,744,047 A | 5/1988 | Okamoto et al. |
| 4,786,149 A | 11/1988 | Hoenig et al. |
| 4,879,466 A | 11/1989 | Kitaguchi et al. |
| 5,049,901 A | 9/1991 | Gelbart |
| 5,079,544 A | 1/1992 | DeMond et al. |
| 5,082,755 A | 1/1992 | Liu |
| 5,106,455 A | 4/1992 | Jacobsen et al. |
| 5,109,290 A | 4/1992 | Imai |
| 5,121,983 A | 6/1992 | Lee |
| 5,131,976 A | 7/1992 | Hoko |
| 5,132,723 A | 7/1992 | Gelbart |
| 5,138,368 A | 8/1992 | Kahn et al. |
| 5,195,103 A | 3/1993 | Hinton et al. |
| 5,208,818 A | 5/1993 | Gelbart et al. |
| 5,269,882 A | 12/1993 | Jacobsen |
| 5,281,996 A | 1/1994 | Bruning et al. |
| 5,300,966 A | 4/1994 | Uehira et al. |
| 5,361,272 A | 11/1994 | Gorelik |
| 5,416,729 A | 5/1995 | Leon et al. |
| 5,431,127 A | 7/1995 | Stevens et al. |

(Continued)

FOREIGN PATENT DOCUMENTS

EP    0552953    7/1993

(Continued)

OTHER PUBLICATIONS

"New Multi-EB Direct Write Concept for Maskless High Throughput", Canon SubMicron Focus, vol. 5, Summer 2000.

(Continued)

*Primary Examiner*—Zoila Cabrera
(74) *Attorney, Agent, or Firm*—Smith, Gambrell & Russell, LLP (57) ABSTRACT

A method and system is provided for moving a substrate relative to a pixel panel in a digital photolithography system. The method can be used for performing photolithography on a substrate, the substrate having a first portion with a first design resolution and a second portion with a second design resolution. The method includes scanning the first portion of the substrate, having the first design resolution, at a first speed and scanning the second portion of the substrate, having the second design resolution, at a second speed, different from the first.

7 Claims, 6 Drawing Sheets

U.S. PATENT DOCUMENTS

| | | |
|---|---|---|
| 5,461,455 A | 10/1995 | Coteus et al. |
| 5,691,541 A | 11/1997 | Ceglio et al. |
| 5,793,473 A | 8/1998 | Koyama et al. |
| 5,818,498 A | 10/1998 | Richardson et al. |
| 5,835,458 A | 11/1998 | Bischel et al. |
| 5,850,310 A | 12/1998 | Schweizer |
| 5,870,176 A | 2/1999 | Sweatt et al. |
| 5,892,231 A | 4/1999 | Baylor et al. |
| 5,900,637 A | 5/1999 | Smith |
| 5,905,545 A | 5/1999 | Poradish et al. |
| 5,909,658 A | 6/1999 | Clarke et al. |
| 5,949,557 A | 9/1999 | Powell |
| 5,955,776 A | 9/1999 | Ishikawa |
| 5,995,129 A | 11/1999 | Sunagawa et al. |
| 5,995,475 A | 11/1999 | Gelbart |
| 5,998,069 A | 12/1999 | Cutter et al. |
| 6,014,203 A | 1/2000 | Ohkawa |
| 6,048,011 A | 4/2000 | Fruhling et al. |
| 6,052,517 A | 4/2000 | Matsunaga et al. |
| 6,061,118 A | 5/2000 | Takeda |
| 6,071,315 A | 6/2000 | Ramamurthi et al. |
| 6,072,518 A | 6/2000 | Gelbart |
| 6,084,656 A | 7/2000 | Choi et al. |
| 6,107,011 A | 8/2000 | Gelbart |
| 6,124,876 A | 9/2000 | Sunagawa |
| 6,133,986 A | 10/2000 | Johnson |
| 6,205,364 B1 | 3/2001 | Lichtenstein et al. |
| 6,238,852 B1 | 5/2001 | Klosner |
| 6,251,550 B1 | 6/2001 | Ishikawa |
| 6,252,717 B1 | 6/2001 | Grosskopf |
| 6,304,316 B1 * | 10/2001 | Jain et al. ..................... 355/53 |
| 2003/0090772 A1 * | 5/2003 | Karin et al. ................ 359/212 |

FOREIGN PATENT DOCUMENTS

| | | |
|---|---|---|
| WO | WO 9110170 | 7/1991 |

OTHER PUBLICATIONS

Sandstrom and Odselius, "Large-Area High Quality Photomasks", Micronic Laser Systems, published by SPIE, vol. 2621, 1985, pp. 312-318.

Singh-Gasson, Sangeet et al., Maskless Fabrication of Light-Directed Oligonucleotide Microarrays Using a Digital Micromirror Array, vol. 17, No. 10, Oct. 1999, pp. 974-978.

Devitt, Terry, "Advanced May Put Gene Chip Tecnology on Scientists Desktops", http://www.biotech.wise.edu/Education/biotechnews/GeneChip.html, Oct. 7, 1999.

* cited by examiner

MODIFIED PHOTOLITHOGRAPHY MOVEMENT SYSTEM

BACKGROUND

The present disclosure relates generally to imaging systems, and more particularly, to a system and method for moving a system relative to a substrate during exposure.

Imaging systems frequently utilize one or more light sources during scanning processes. For example, a photolithography system may use a light source such as a mercury lamp to project an image onto a substrate such as a semiconductor wafer or a printed circuit board. Within the photolithography system, light projected by the light source may be directed by a pixel panel or other image-creating device to control the path of the light.

Limitations in an imaging system may be introduced by the components which form the imaging system, such as the pixel panel described above. The pixel panel should be able to properly redirect the light projected by the light source towards a substrate, but may be limited by such factors as the amount of resolution required and/or the rate at which the pixel panel can change states. The rate at which the pixel panel can change states is often determined by the rate at which data can be supplied to the pixel panel.

One solution is to move the pixel panel very slow, relative to the substrate on which the exposure process is being performed. By having such slow movement, a very high resolution image can be obtained and/or a complex pattern can be provided to the pixel panel. However, this slow movement is often undesirable in a manufacturing process because overall through put of substrates is substantially hindered.

SUMMARY OF INVENTION

A technical advance is provided by a novel system and method for projecting light onto a substrate. In one embodiment, the method can be used for exposing a substrate, the substrate having a first portion with a first design resolution and a second portion with a second design resolution. The method includes scanning the first portion of the substrate at a first speed and scanning the second portion of the substrate at a second speed, different from the first. Both the first and second portions are scanned on a single pass.

In one embodiment, the system is a digital photolithography system including a pixel panel and a stage for holding the substrate. The system includes means for exposing the substrate by scanning the substrate in a single pass and a pair of movement means. The first movement means is for moving the pixel panel relative to the substrate at a relatively fast speed while exposing a first portion of the substrate. The second movement means is for moving the pixel panel relative to the substrate at a relatively slow speed while exposing a second portion of the substrate in the single pass.

An advantage provided by the present invention is that the speed at which the exposure is performed on the substrate is increased for portions of the substrate that are not complex and/or do not require a very high image resolution.

DETAILED DESCRIPTION

The present disclosure relates to imaging systems, and more particularly, to a system and method for controlling the relative movement between the imaging system and a substrate to maximize factors such as design resolution and exposure speed. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
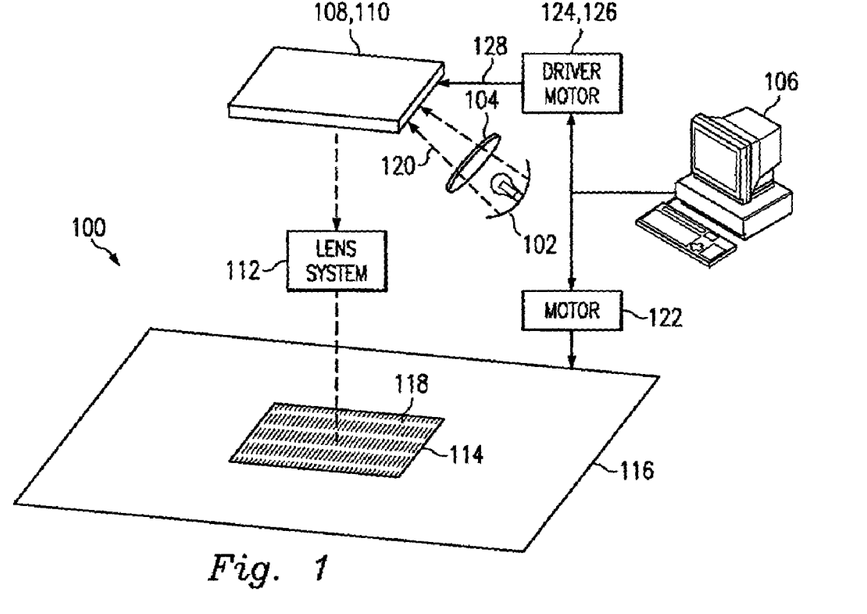
FIG. 1 is a diagrammatic view of one example of a digital photolithography system that can benefit from various embodiments of the present invention.

Referring now to FIG. 1, a maskless photolithography system 100 is one example of a system that can benefit from the present invention. In the present example, the maskless photolithography system 100 includes a light source 102, a first lens system 104, a computer aided pattern design system 106, a pixel panel 108, a panel alignment stage 110, a second lens system 112, a substrate 114, and a substrate stage 116. A resist layer or coating 118 may be disposed on the substrate 114. The light source 102 may be an incoherent light source (e.g., a Mercury lamp) that provides a collimated beam of light 120 which is projected through the first lens system 104 and onto the pixel panel 108. Alternatively, the light source 102 may be an array comprising, for example, laser diodes or light emitting diodes (LEDs) that are individually controllable to project light.

The lens system 112 may incorporate many different lenses, and/or many different types of lenses. For example, a micro-lens array can be used, as well as a Fresnel lens. In addition, one or more shadow masks and/or filters can be used as required. It is understood that the use of various lenses and filters is well known in the art, and often depends upon a particular set of requirements or a particular application.

The pixel panel 108, which may be a LED, a deformable (or digital) mirror device (DMD), a fiber array, or a diode array, is provided with digital data via suitable signal line(s) 128 from the computer aided pattern design system 106 to create a desired pixel pattern (the pixel-mask pattern). The pixel-mask pattern may be available and resident at the pixel panel 108 for a desired, specific duration. Light emanating from (or through) the pixel-mask pattern of the pixel panel 108 then passes through the second lens system 112 and onto the substrate 114. In this manner, the pixel-mask pattern is projected onto the resist coating 118 of the substrate 114.

The computer aided mask design system 106 can be used for the creation of the digital data for the pixel-mask pattern. The computer aided pattern design system 106 may include computer aided design (CAD) software similar to that which is currently used for the creation of mask data for use in the manufacture of a conventional printed mask. Any modifications and/or changes required in the pixel-mask pattern can be made using the computer aided pattern design system 106. Therefore, any given pixel-mask pattern can be changed, as needed, almost instantly with the use of an appropriate instruction from the computer aided pattern design system 106. The computer aided mask design system 106 can also be used for adjusting a scale of the image or for correcting image distortion.

In some embodiments, the computer aided mask design system 106 is connected to a first motor 122 for moving the stage 116, and a driver 124 for providing digital data to the pixel panel 108. In some embodiments, an additional motor 126 may be included for moving the pixel panel. The system 106 can thereby control the data provided to the pixel panel 108 in conjunction with the relative movement between the pixel panel 108 and the substrate 114.

Figure 2:
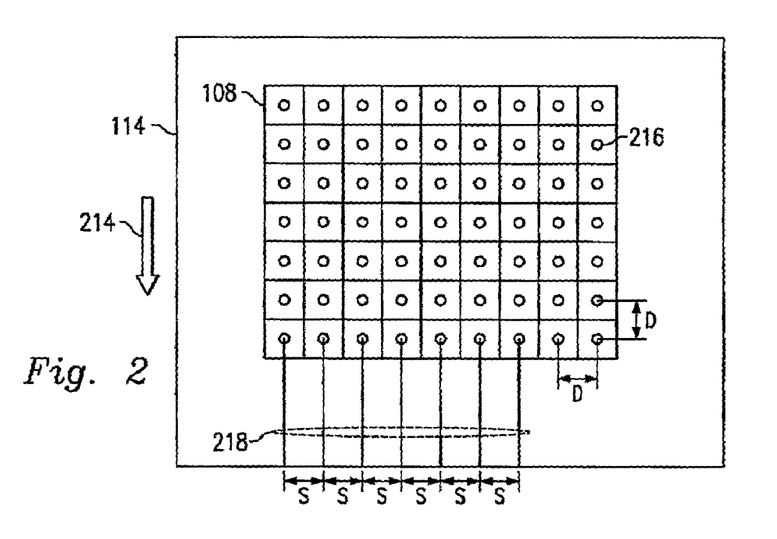
FIG. 2 illustrates an exemplary point array aligned with a substrate.

Referring now to FIG. 2, the pixel panel 108 (comprising a DMD) of FIG. 1 is illustrated. The pixel panel 108 described in relation to FIG. 1 has a limited resolution which depends on such factors as the distance between pixels, the size of the pixels, and so on. However, higher resolution may be desired and may be achieved as described below. The pixel panel 108, which is shown as a point array for purposes of clarification, projects an image (not shown) upon the substrate 114, which may be a substrate. The substrate 114 is moving in a direction indicated by an arrow 214. Alternatively, the point array 108 could be in motion while the substrate 114 is stationary, or both the substrate 114 and the point array 108 could be moving simultaneously. The point array 108 is aligned with both the substrate 114 and the direction of movement 214 as shown. A distance, denoted for purposes of illustration as "D", separates individual points 216 of the point array 108. In the present illustration, the point distribution that is projected onto the substrate 114 is uniform, which means that each point 216 is separated from each adjacent point 216 both vertically and horizontally by the distance D.

As the substrate 114 moves in the direction 214, a series of scan lines 218 indicate where the points 216 may be projected onto the substrate 114. The scan lines are separated by a distance "S". Because of the alignment of the point array 108 with the substrate 114 and the scanning direction 214, the distance S between the scan lines 218 equals the distance D between the points 216. In addition, both S and D remain relatively constant during the scanning process. Achieving a higher resolution using this alignment typically requires that the point array 108 embodying the DMD be constructed so that the points 216 are closer together. Therefore, the construction of the point array 108 and its alignment in relation to the substrate 114 limits the resolution which may be achieved.

Figure 3:
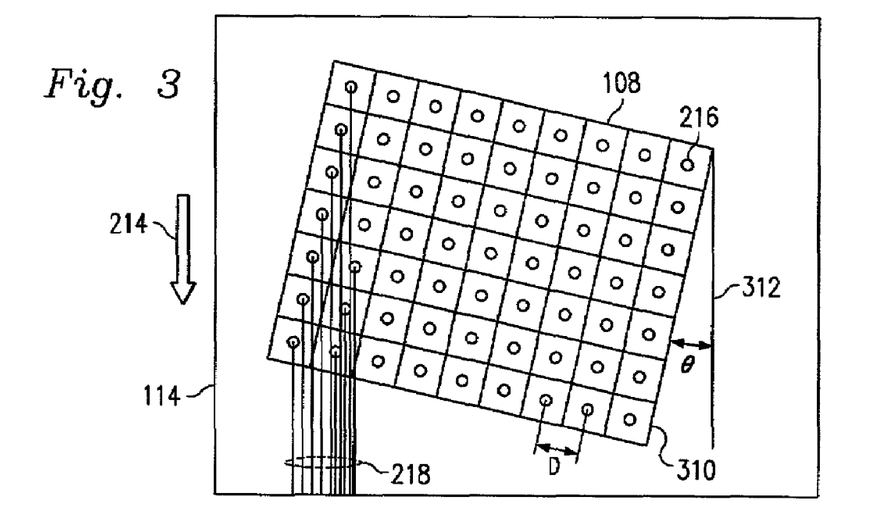
FIG. 3 illustrates the point array of FIG. 2 after being rotated relative to the substrate.

Referring now to FIG. 3, a higher resolution may be achieved with the point array 108 of FIG. 2 by rotating the DMD embodying the point array 108 in relation to the substrate 114. The rotation is identified by an angle between an axis 310 of the rotated point array 108 and a corresponding axis 312 of the substrate. As illustrated in FIG. 3, although the distance D between the points 216 remains constant, such a rotation may reduce the distance S between the scan lines 218, which effectively increases the resolution of the point array 108. The image data that is to be projected by the point array 108 must be manipulated so as to account for the rotation of the point array 108.

The magnitude of the angle may be altered to vary the distance S between the scan lines 218. If the angle is relatively small, the resolution increase may be minimal as the points 216 will remain in an alignment approximately equal to the alignment illustrated in FIG. 2. As the angle increases, the alignment of the points 216 relative to the substrate 114 will increasingly resemble that illustrated in FIG. 3. If the angle is increased to certain magnitudes, various points 216 will be aligned in a redundant manner and so fall onto the same scan line 218. Therefore, manipulation of the angle permits manipulation of the distance S between the scan lines 218, which affects the resolution of the point array 108. It is noted that the distance S may not be the same between different pairs of scan lines as the angle is altered.

Figure 4:
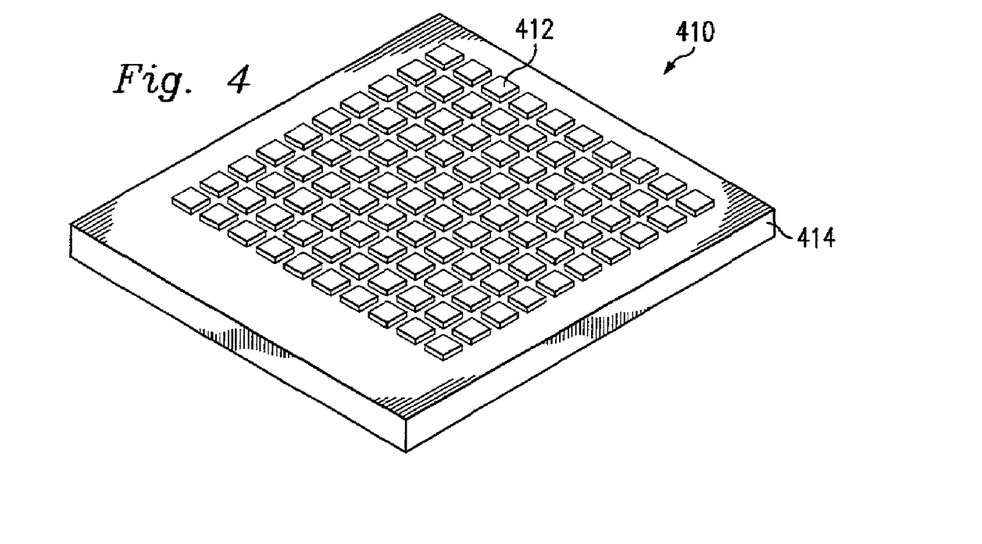
FIG. 4 illustrates a laser diode array that may be used in the system of FIG. 1.

Referring now to FIG. 4, in another embodiment, the conventional light source 102 of FIG. 1 may be replaced by a diode array 410, which may be an array of LEDs or laser diodes (both of which are hereinafter referred to as a laser diode array for purposes of clarity). The laser diode array 410 may comprise a plurality of laser diodes 412 embedded within or connectable to a substrate 414. The substrate 414 may be relatively translucent and so may enable light to pass through the substrate 414. The translucency may depend on the thinness of the substrate and/or the material of which it is made. For example, the substrate 414 may be made of a material such as sapphire to enhance the translucency of the substrate 414. In the present example, each laser diode 412 may be positioned relative to the substrate 414 so that light projected by the laser diodes 412 passes through, rather than away from, the substrate 414.

In operation, each laser diode 412 may be turned on and off by controlling the power supplied to each laser diode 412. The individual laser diodes 412 may be controlled by signal and/or power lines to either project light or not project light (e.g., be "on" or "off") onto the pixel panel 108. Alternatively, the laser diode array 410 may project light directly onto the substrate 114 of FIG. 1, replacing the pixel panel 108. A variety of arrangements of the laser diode array 410 in the system 100 of FIG. 1 are illustrated in greater detail in U.S. patent application Ser. No. 09/820,030, filed on Mar. 28, 2001, and also assigned to Ball Semiconductor, Inc., entitled "INTEGRATED LASER DIODE ARRAY AND APPLICATIONS" and hereby incorporated by reference as if reproduced in its entirety.

Figure 5:
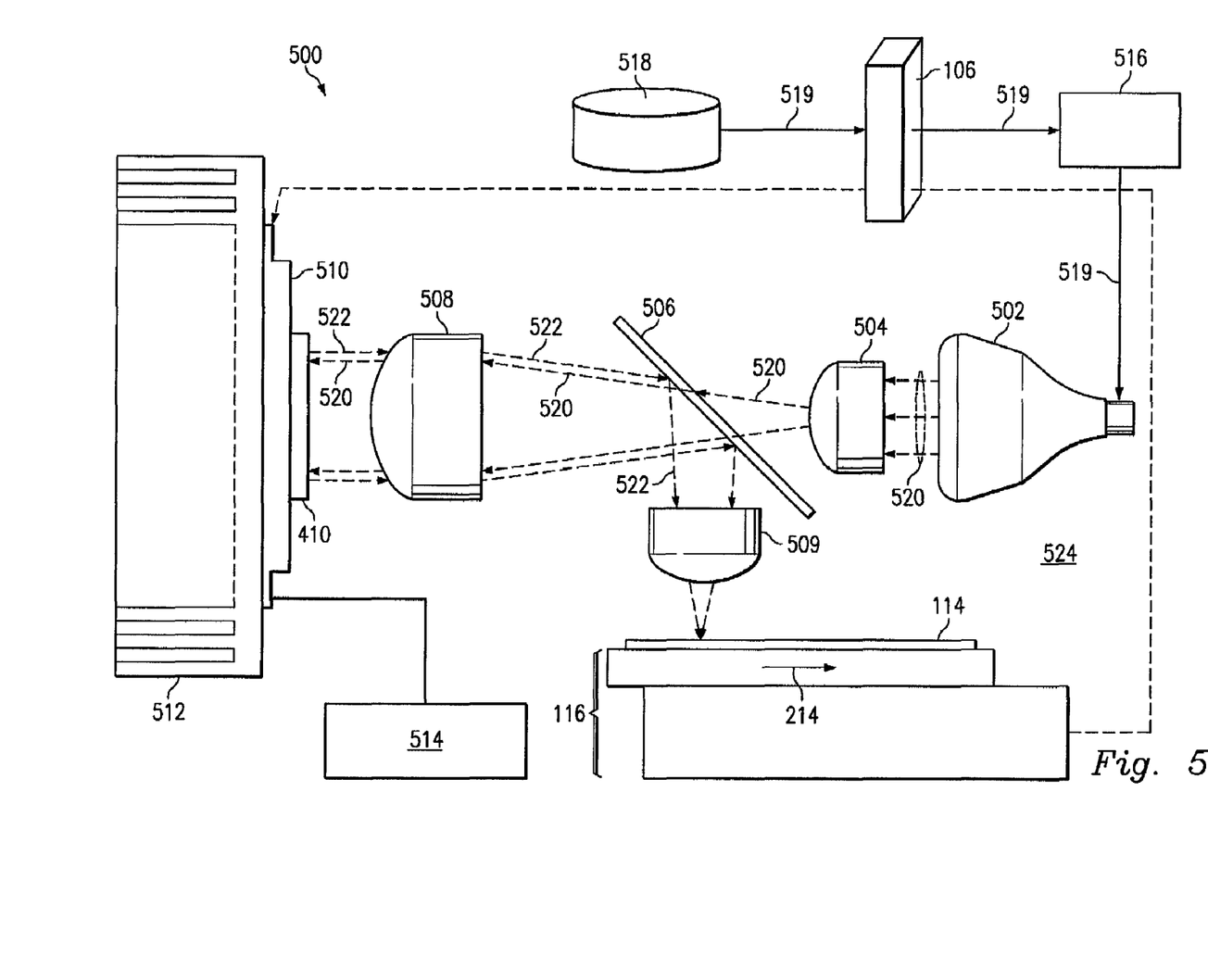
FIG. 5 is a diagrammatic view of another example of a digital photolithography system that can benefit from various embodiments of the present invention.

Referring now to FIG. 5, in another embodiment, an imaging system 500 may replace some or all of the components of the photolithography system 100 of FIG. 1. The system 500 is operable to project an image produced by a light source 502 onto the substrate 114 with sufficient intensity for photolithography using the diode array 410 of FIG. 4. In the present example, the imaging system 500 includes the light source 502, which may be a cathode ray tube (CRT), a first lens 504, a mirror 506, a second lens 508, a third lens 509, the diode array 410, an integrated circuit (IC) 510, which may be a power IC capable of amplifying a signal, a cooling device 512, and a power supply 514. The computer 106 may control the CRT 502 using a driver 516. Data for the system 500 may be obtained from a database 518 that is accessible to the computer 106, and may follow a path indicated by arrows 519.

In operation, the computer 106 sends data via the path 519 to the CRT 502, which may be capable of projecting a relatively large amount of image data. The image (represented by the light beams 520) projected by the CRT 502 passes through the lens 504, which may be single lens or a lens system comprising a variety of optical components. For example, the lens 504 may comprise one or more lenses, optical gratings, microlens arrays, and/or other optical devices to aid in passing the image projected by the CRT 502 to the mirror 506. In the present example, the lens 504 is mono-directional and directs the light 520 projected by the CRT 502 onto the mirror 506. The mirror 506 may be an ultraviolet (UV) light mirror designed to allow the light 520 to pass from the lens 504 through to the lens 508, but not allow the light 522 to pass from the lens 508 to the lens 504. Rather, the light 522 may be reflected by the mirror 506 towards the substrate 114.

The lens 508, which may be a bi-directional lens system, directs the image onto the diode array 410. The structure and operation of the diode array 410 and the IC 510 will be discussed later in greater detail, and so will be summarized while describing the operation of the system 500. The IC 510, in response to the projection of the light 520 through the diode array 410 and onto the IC 510, may provide power to various diodes 412 of the diode array 410 corresponding to locations on the IC 510 that receive the light 520. The IC 510 may also provide amplification, so that, for example, the received light 520 is intensified.

Figure 6:
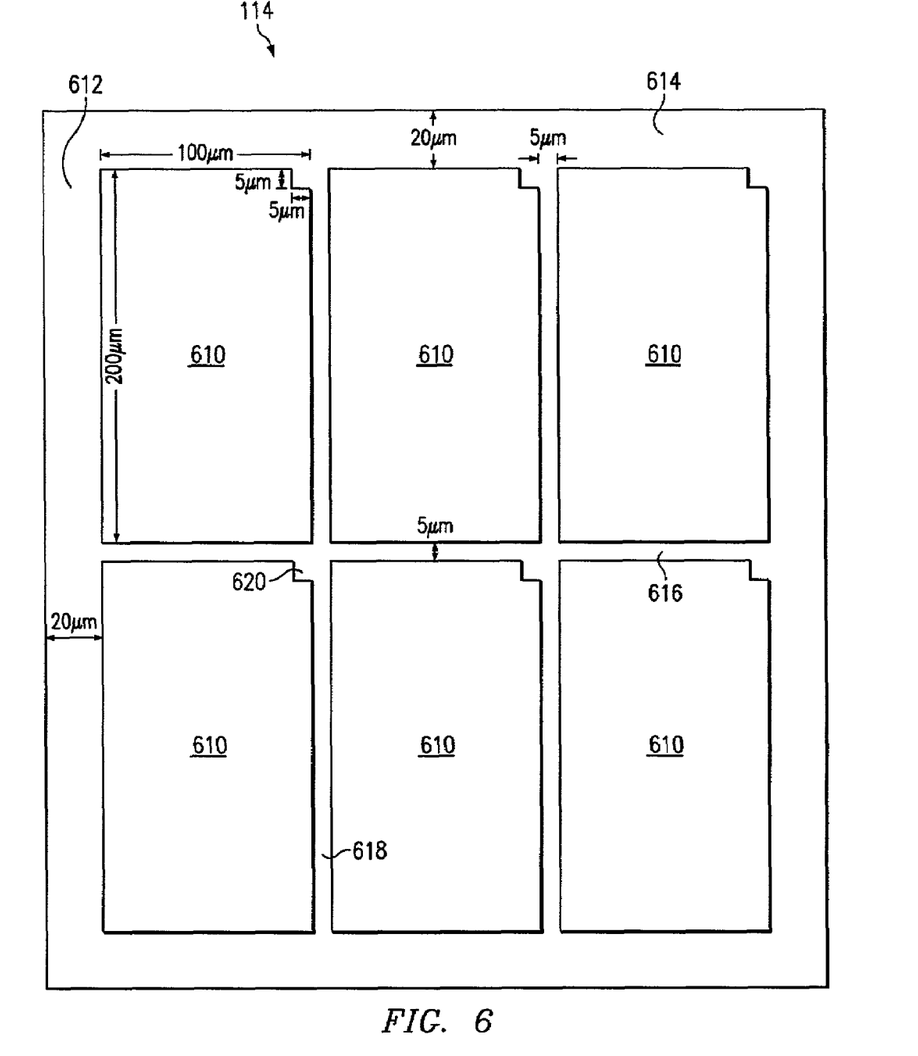
FIG. 6 illustrates one example of a substrate with a circuit pattern that is to be exposed by the photolithography systems of either FIG. 1 or 5.

The diode array 410, in response to the projection of the image onto the diode array 410 and the IC 510 by the lens 508, may project a plurality of laser beams 522 representing the image onto the lens 508. The laser beams 522 may be of a different wavelength than the light 520. The length of time during which the laser beams 522 are projected by the laser diode array 410 may be controlled. For example, a duration setting may be used to define a length of time that the laser beams 522 are to be projected. Accordingly, the length of time that the image is projected by the CRT 502 may differ from the length of time that the laser diode array 410 projects the laser beams 522. The laser beams 522 pass through the lens 508 and are directed by the mirror 506 onto the lens 509, which in turn projects the beams 522 onto the substrate 114. The operation of the system 500 may also include data sent from the stage 116 to the computer 106, as indicated by an arrow 524. The data may, for example, aid in synchronizing the motion of the substrate 114 with the projection of the laser beams 522 (e.g., the duration of the laser beams 522, etc.)Referring now to FIG. 6, for the sake of example, the substrate 114 will be used for a liquid crystal display (LCD). The image of FIG. 6 illustrates a simplified view of the substrate 114 as it will be upon completion of a photolithography operation according to one embodiment of the present invention. The following disclosure provides examples of sizes and resolution requirements for various circuits in the substrate 114 to illustrate the benefits of the present invention. It is understood, however, that these examples are merely for the sake of providing a simplified application that would benefit from the present invention, and in no way are intended to limit the present invention to LCDs or to any particular circuits, sizes, or resolutions.

The LCD substrate 114 includes a plurality of pixel sections 610 that are relatively large. For the sake of further example, each pixel section 610 has a vertical "height" (as shown in the Figure) of 200 microns and a horizontal "width" of 100 microns. Although only a few pixel sections 610 are illustrated, it is anticipated that some substrates 114 may have an array of 600×800 pixel sections or more. The design requirement for the pixel sections 610 is a 10 micron resolution. The design requirement is a term that represents a general resolution for the circuit elements, such as a minimum line width for a metal conductor.

Outer edges 612, 614 of the LCD substrate 114 include a plurality of peripheral circuits, such as row and column decoders and other circuits well known in the art. Although they can often be designated as a single peripheral circuit area, for the sake of reference peripheral circuits 612 are positioned in the left and right vertical edges of the substrate as shown in the Figure, and peripheral circuits 614 are positioned in the upper and lower horizontal edges of the substrate as shown. The peripheral circuits 612, 614 have a width of 20 microns. The design requirement for the peripheral circuits 612, 614 is a 5 micron resolution. Furthermore, the overall electrical design of the peripheral circuits 612, 614 is relatively complex and does not repeat as often as some of the other components discussed above and below.

Running between the pixel sections 610 are a plurality of horizontal circuit elements 616 and vertical circuit elements 618. For the sake of simplicity, the circuit elements 616, 618 can simply be regarded as conductors, although other circuits can also be accommodated. The conductors 616, 618 run in a space between the pixel sections 610, which in the present example is about 5 microns wide. The design requirement for the conductors 616, 618 is a 5 micron resolution.

On what appears to be the upper right hand corner of each pixel section 610 is a very small circuit 620. In the present embodiment, the circuits 620 are thin film transistors and require about a 5 micron×5 micron portion of the corresponding pixel section 610. The design requirement for the thin film transistors 620 is a 1 micron resolution. The thin film transistors 620 are relatively simple circuits, as compared to the peripheral circuits 612, 614.

Figure 7:
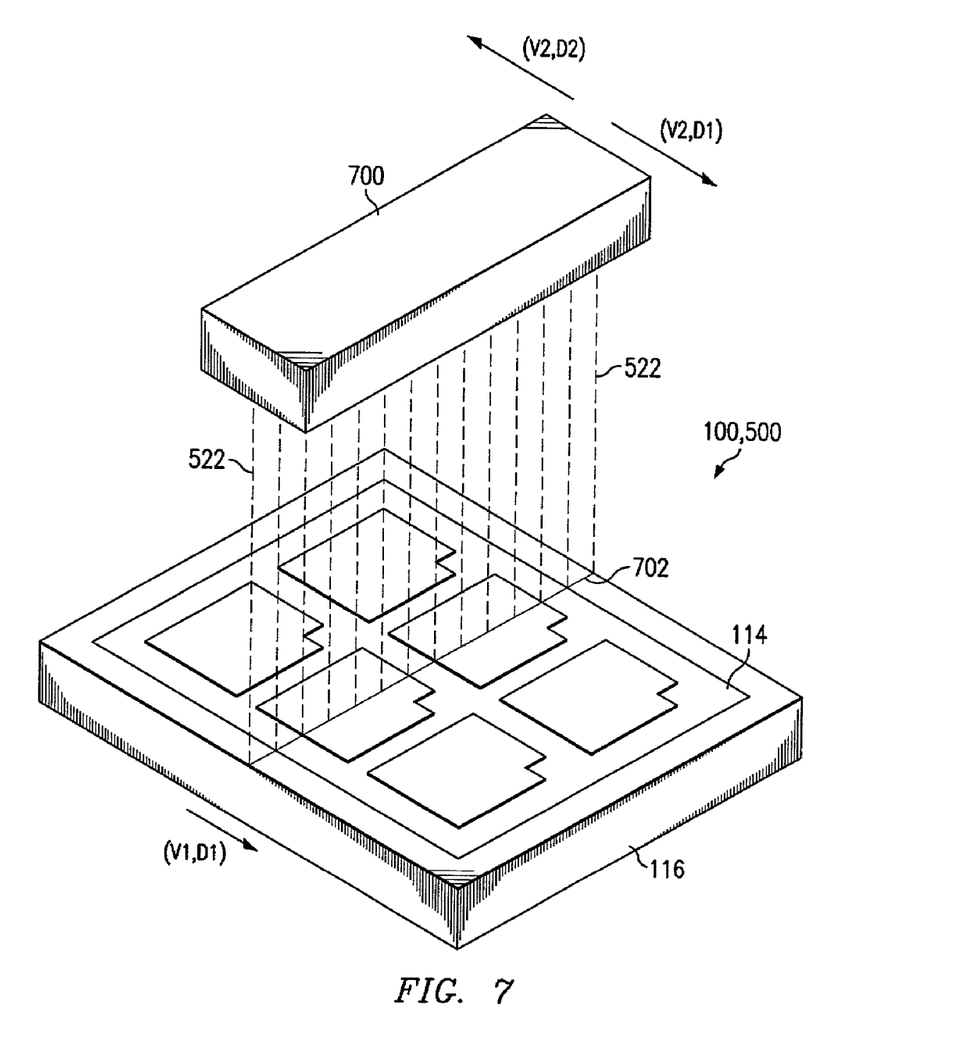
FIG. 7 is a block diagram of a photolithography system implementing features of one embodiment of the present invention upon the substrate of FIG. 6.

Referring now to FIG. 7, a simplified version of the photolithography system 100 (FIG. 1) is shown. A box 700 represents the portion of the system that project the image to be exposed, hereinafter referred to as the "head." For example, the head 700 may include the pixel panel 108 and the lens system 112 (both of FIG. 1). It is understood that a wide variety of image systems can be used, and the head may incorporate different components.

The photolithography system 100 scans produces a "scan line" 702 that eventually scans the entire image to be exposed (in the present example, the LCD design discussed with reference to FIG. 6). The scan line 702 may not be an actual line, but a portion of the entire image to be scanned. Although photolithography systems are often categorized as either scanning or stepping systems, it is understood that both such technologies and/or combinations of such technologies can benefit from the present invention, and that a scanning system is being illustrated merely for the sake of example.

Both the head 700 and the stage 116 can move independently of each other. Referring also to FIG. 1, in the present embodiment, the head 700 is moved by the motor 126, the stage 116 and the substrate 114 are moved by the motor 122, and the motors 126, 122 are controlled by software running in the computer 106. The movement of the head 700 and the substrate 114 are represented by vectors (v1, d1), (v2, d1), and (v2, d2). The "v" designates a speed component and the "d" designates a direction component. For the sake of further example, the motor 126 that moves the head 700 is a vibrator that can move the head back and forth, and the motor 122 is a linear movement type motor. In the present embodiment, the direction components of d1, d2 are diametrically opposed to each other and the speed component of v1 is greater than the speed component of v2.

Also in the present embodiment, the stage 116 is relatively heavy, when compared to the head 700. For this reason, the stage 116 will move at the constant direction/speed (v1, d1). In contrast, the head 700 can move in the direction d2 or in the opposite direction d1. In addition, the head 700 can be stopped altogether, so that v2=0. It is understood, however, that in other embodiments, different motors and different variation of speed may apply.

The relative scanning speed and direction between the head 700 and the stage 116 can be a function of one or more of v1, v2, d1, and d2. In the present embodiment, the relative scanning speed and direction describe the movement of the scanning line 702. For the sake of further example, the scanning line 702 only moves in the direction d1. However, the speed at which the scanning line 702 moves can change for various requirements. These requirements may include the design resolution being exposed, the complexity of the image being exposed (and hence the amount of time required to provide all of the changing data to the pixel panel 108 (FIG. 1) or the time required for individual pixels of the pixel element to change), different lens characteristics of the lens system 112 (also of FIG. 1), and so forth. Further to the present example, a fast speed Vf is determined by the equation: Vf=v1+v2.

A medium speed Vm is determined by the equation: Vm=v1.

A slow speed Vs is determined by the equation: Vs=v1+−v2.

A negative v2 (−v2) is produced by moving the head 700 at the speed v2 in the direction d2, opposite of the direction d1.

Figure 8A:
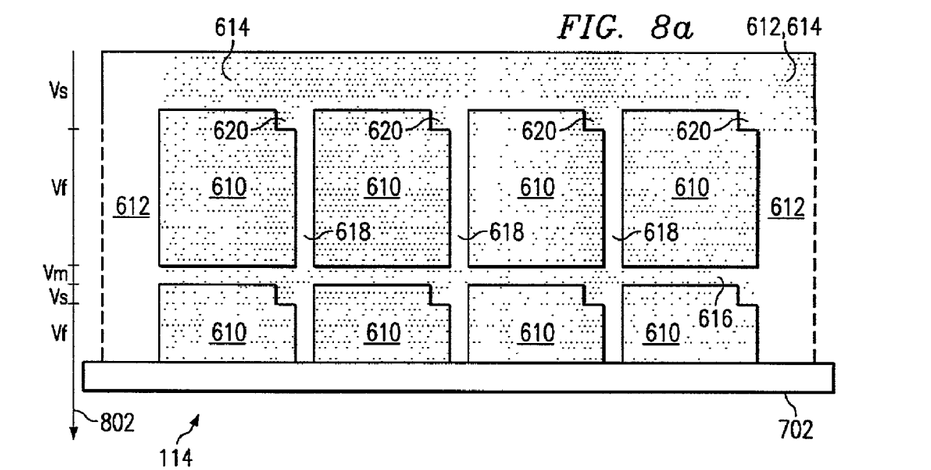
FIGS. 8a and 8b are operational views of the photolithography system of FIG. 7 implementing one embodiment of a method according to the present invention.
Figure 8B:
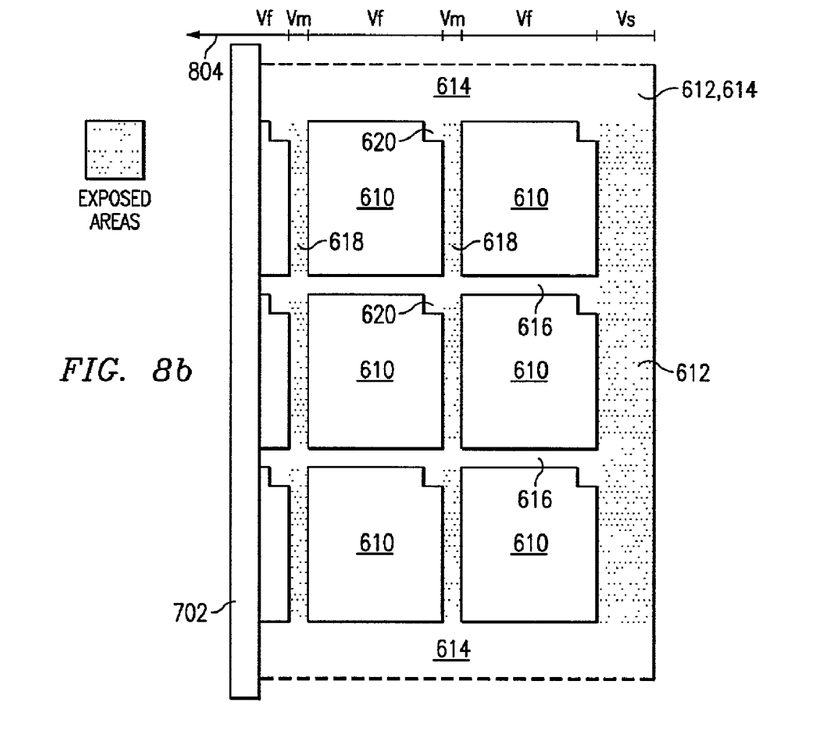

Referring now to FIGS. 8a and 8b, in the present example, the photolithography system 100 will expose the substrate 114 in two passes. The first pass is illustrated in FIG. 8a and the second pass is illustrated in FIG. 8b. Also in the present example, the two passes occur at a 90° angle to each other. For each pass, some or all of the substrate may be exposed. However, by combining the two passes, all of the substrate is eventually exposed. It is understood that the number of passes required is dependent upon various factors, such as the desired electronic design to be exposed on the substrate 114. In the present example, the electronic design is for a LCD (as shown in FIG. 6).

Referring specifically to FIG. 8a, in the first pass, the scan line 702 moves in a direction 802, as shown. The direction 802 corresponds with the direction d1 shown in FIG. 7. However, the scanning speed changes for different portions of the substrate, as illustrated. When exposing the peripheral circuits 614, which have a design resolution of 5 microns, but have a very dense circuit pattern, the scanning speed is slow (Vs). Likewise, when exposing the thin film transistors 620, which have a design resolution of 1 micron, the scanning speed is slow (Vs). When exposing the pixel sections 610, which have a design resolution of 10 microns, the scanning speed is fast (Vf). When exposing the conductors 616, which have a design resolution of 5 microns, the scanning speed is medium (Vm). It is noted that in the present example, the conductors 618 and the peripheral circuits 612 are not exposed, except where the peripheral circuits 612, 614 intersect and where the conductors 618, 620 intersect.

Referring now to FIG. 8b, in the second pass, the scan line 702 moves in a direction 804, as shown. The substrate 114 has now been rotated 90° (relative to the head 700) so that the direction 804 now corresponds with the direction d1 shown in FIG. 7, but is perpendicular to the direction 802 illustrated in FIG. 8a. However, the scanning speed changes for different portions of the substrate, as illustrated. When exposing the peripheral circuits 612, which have a design resolution of 5 microns, but have a very dense circuit pattern, the scanning speed is slow (Vs). The pixel sections 610 are not exposed, so the system "jumps" over these sections relatively fast (Vf). When exposing the conductors 618, which have a design resolution of 5 microns, the scanning speed is medium (Vm). It is noted that in the present example, the thin film transistors 620, pixel sections 610, conductors 616 and the peripheral circuits 614 are not exposed (or are exposed very quickly). In some embodiments, it may be desirable to re-exposed the circuit portions where the peripheral circuits 612, 614 intersect and where the conductors 618, 620 intersect.

In some embodiments, some areas may be exposed in both passes (as shown in FIG. 8a and in FIG. 8b). For example, the pixel sections 610 may be exposed in both passes so that the image is double-exposed during the fast scanning (Vf).

Although not shown, it may be desirable to produce additional passes to complete the exposure. The additional passes may expose circuit portions that were not previously exposed, or may be used to further expose some circuit portions due to various requirements (e.g., for circuits with very high design resolution requirements). Even with the multiple passes, a significant time savings can be achieved if a portion of the overall circuit does not require the slow scanning movement.

While the invention has been particularly shown and described with reference to the preferred embodiment thereof, it will be understood by those skilled in the art that various changes in form and detail may be made therein without departing from the spirit and scope of the invention. For example, a mask-type photolithography system can be used. Such a system works especially well when there is significant repetition in the design circuit. Therefore, the claims should be interpreted in a broad manner, consistent with the present invention.

The invention claimed is:

1. A method for performing digital photolithography on a substrate, the substrate having a first portion with a first design resolution and a second portion with a second design resolution, the method comprising:
   scanning the first portion of the substrate at a first speed, comprising moving the substrate relative to the head at a third speed in a first direction; and moving the head relative to the substrate at a fourth speed in the first direction while scanning the first portion of the substrate, wherein the first speed equals the sum of the third and fourth speeds; and
   scanning the second portion of the substrate at a second speed different from the first speed, comprising moving the head relative to the substrate at a fifth speed in a second direction opposite to the first direction while scanning the second portion of the substrate, wherein the second speed equals the difference of the third and fifth speeds;
   wherein both the first and second portions are scanned on a single pass.

2. The method of claim 1 wherein the fourth and fifth speeds are the same.

3. Software for controlling the movement of a first motor for moving an image producing device during exposure of a substrate, wherein the substrate includes a plurality of circuit components arranged in rows and at least one horizontal component between consecutive rows of the circuit components, the software comprising instructions for:

moving the image producing device at a first speed and in a first direction while exposing the at least one horizontal component; and moving the image producing device at a second speed and in a second direction opposite from the first direction while exposing the plurality of circuit components;

wherein the substrate constantly moves at a third speed in the first direction during the exposing, and the third speed is greater than the second speed.

4. The method of claim 3 wherein the first speed equals the second speed and the first direction is perpendicular to the rows.

5. The method of claim 3 wherein the first speed equals zero.

6. The method of claim 3 further comprising: providing digital data to the image producing device corresponding to the movement of the image producing device at the first and second speeds.

7. The method of claim 3 wherein the image producing device is a deformable mirror device (DMD).

* * * * *